United States Patent
Krans et al.

(10) Patent No.: US 6,218,664 B1
(45) Date of Patent: Apr. 17, 2001

(54) SEM PROVIDED WITH AN ELECTROSTATIC OBJECTIVE AND AN ELECTRICAL SCANNING DEVICE

(75) Inventors: Jan M. Krans; Marcellinus P. C. M. Krijn; Alexander Henstra, all of Eindhoven (NL)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 09/216,256

(22) Filed: Dec. 18, 1998

(30) Foreign Application Priority Data

Dec. 23, 1997 (EP) .................................................. 97204090

(51) Int. Cl.⁷ .............................. H01J 37/26; H01J 37/12

(52) U.S. Cl. ...................... 250/310; 250/396 R; 250/397

(58) Field of Search ............................... 250/310, 396 R, 250/397

(56) References Cited

U.S. PATENT DOCUMENTS 5,644,132 * 7/1997 Litman et al. ...................... 250/310

OTHER PUBLICATIONS

"Design of a High–Resolution Low–Voltage Scanning Electron Microscope", by J. Zach, Optik, vol. 83, No. 1 (1989), pp. 30–40.

* cited by examiner

*Primary Examiner*—Teresa M. Arroyo
*Assistant Examiner*—Nikita Wells
(74) *Attorney, Agent, or Firm*—Michael O. Scheinberg; Ann E. Barchall

(57) ABSTRACT

The detector 6 for the secondary electrons in a SEM provided with an electrostatic objective 14, 16 is arranged ahead of the objective, thus enabling a high detection efficiency. According to the invention, the deflection of the beam is performed electrically and the deflection electrodes 10, 12 are arranged between the detector 6 and the last two electrodes 14, 16 of the objective. The beam deflection is realized by means of two oppositely directed electrical deflection fields in such a manner that the tilting point of the scanning motion is situated at the center 20 of the objective lens, thus avoiding additional lens defects and obstruction of the beam by the limited dimensions of the objective bore. This results in a large field of view, without loss of resolution. Furthermore, deflection by means of two oppositely directed fields has the effect that the paths 24 of the secondary electrons traveling to the detector 6 are shaped such that a larger part thereof reaches the detection material 6.

6 Claims, 3 Drawing Sheets

SEM PROVIDED WITH AN ELECTROSTATIC OBJECTIVE AND AN ELECTRICAL SCANNING DEVICE

The invention relates to a particle-optical apparatus which includes a particle source for producing a primary beam of electrically charged particles which travel along an optical axis of the apparatus, a specimen holder for a specimen to be irradiated by means of the apparatus, a focusing device for forming a focus of the primary beam in the vicinity of the specimen holder by means of electrostatic electrodes, a beam deflection system for deflecting the primary beam, detection means for detecting electrically charged particles which emanate from the specimen in response to the incidence of the primary beam, which detection means are arranged ahead of the focusing device, viewed in the propagation direction of the electrically charged particles in the primary beam.

A particle-optical apparatus of this kind is known from an article entitled "Design of a high-resolution low-voltage scanning electron microscope" by J. Zach in the magazine "Optik", Vol. 83, No. 1 (1989), pp. 30–40.

Apparatus of the kind set forth are known as Scanning Electron Microscopes (SEM). In a SEM a region of a specimen to be examined is scanned by means of a focused primary beam of electrically charged particles, usually electrons, which travel along an optical axis of the apparatus. The acceleration voltage for the electron beam in the SEM is preferably chosen to be comparatively high (for example, of the order of magnitude of 30 kV) with a view to ensuring that only slight electron interaction during their travel through the electron-optical column, so that only a slight energy spread occurs in the electron beam due to this effect. Evidently, the choice of the acceleration voltage, however, is also dependent on the nature of the specimen to be examined. This acceleration voltage should have a comparatively low value (of the order of magnitude of 1 kV) so as to minimize charging of the specimen by the primary electron beam. This could take place, for example during the study of electrically insulating layers in integrated electronic circuits or in the case of given biological specimens. Moreover, for some examinations it is desirable that the electrons of the primary beam penetrate the specimen to a small depth only, resulting in a better contrast of the image to be formed. Thus, it is often desirable that the electron beam traverses the electron-optical column with a comparatively high voltage but is subsequently decelerated to a comparatively low voltage just ahead of the specimen.

Irradiation of the specimen to be examined releases electrically charged particles (generally secondary electrons) which have an energy which is substantially lower, for example of the order of magnitude of from 1 to 50 eV. The energy and/or the energy distribution of these secondary electrons offers information as regards the nature and the composition of the specimen. Therefore, a SEM is attractively provided with a detector for secondary electrons. These electrons are released at the side of the specimen at which the primary beam is incident, after which they travel back against the direction of incidence of the primary electrons. Therefore, when a detector (for example, provided with an electrode carrying a positive voltage) is arranged in the path of the secondary electrons thus traveling back, the secondary electrons are captured by this electrode and the detector outputs an electric signal which is proportional to the electric current thus detected. The (secondary electron) image of the specimen is thus formed in known manner. With a view to the quality of the image, notably the speed at which the image is formed and the signal-to-noise ratio, the detected current is preferably as large as possible.

The cited article by Zach discloses (for example, see the FIGS. 3 and 4 therein) a particle-optical apparatus in the form of a SEM in which the focusing device for forming the focus of the primary beam in the vicinity of the specimen holder is formed by three electrostatic electrodes, the first electrode (viewed in the propagation direction of the electrons in the primary beam) being coincident with a detector.

Nowadays there is a tendency to construct SEMs to be as small as possible. Apart from economical motives (generally speaking, smaller apparatus can be more economically manufactured), such small apparatus offer the advantage that, because of their mobility and small space required, they can be used not only as a laboratory instrument but also as a tool for the formation of small structures, for example as in the production of integrated circuits. In this field a miniaturized SEM can be used for direct production as well as for inspection of products. With a view to direct production, the SEM can be used to write, using electrons, a pattern on the IC to be manufactured. With a view to inspection, the SEM can be used to observe the relevant process during the writing by means of a further particle beam (for example, an ion beam for implantation in the IC to be manufactured), it also being possible to use the SEM for on-line inspection of an IC after execution of a step of the manufacturing process.

For miniaturization of a SEM it is attractive to use an electrostatic objective, because such an objective can be constructed so as to be smaller than-a magnetic lens. This is due to the fact that cooling means (notably cooling ducts for the lens coil) can be dispensed with and that the magnetic (iron) circuit of the lens requires a given minimum volume in order to prevent magnetic saturation. Moreover, because of the temporary requirements as regards high vacuum in the specimen space, electrostatic electrodes (which are constructed as smooth metal surfaces) are more attractive than the surfaces of a magnetic lens which are often provided with coils, wires and/or vacuum rings. Finally, as is generally known in particle optics, an electrical field is a more suitable lens for heavy particles (ions) than a magnetic field.

The arrangement of the detector for the secondary electrons ahead of the focusing device as disclosed in the cited article offers the advantage that when the SEM is used for the observation of ICs, it is also easier to look into pit-shaped irregularities; this is because observation takes place along the same line as that along which the primary beam is incident. Moreover, arranging the detector to the side of the objective and directly above the specimen would have the drawback that the detector would then make it impossible for the distance between the objective and the specimen to be made as small as desirable with a view to the strong reduction of the electron source so as to achieve a size of the scanning electron spot which is sufficiently small with a view to the required resolution. Furthermore, when an electrostatic objective is used in a SEM, it often happens that the electrostatic lens field of the objective extends slightly beyond the physical boundaries of the objective, so possibly as far as the specimen. This would cause secondary electrons emanating from the specimen to be attracted by said field. For example, a detector arranged to the side of the objective would then require a much stronger attractive effect whereby the primary beam would be inadmissibly influenced. This adverse effect is avoided by arranging the detector above the objective.

Even though the cited article by Zach describes a SEM, it does not provide any further details as regards the nature, the appearance and the arrangement of the beam deflection system whereby the scanning motion of the primary beam across the specimen is realized. The cited article does provide some information as regards the detection efficiency for the secondary electrons achieved by the configuration described therein. For the determination of this detection efficiency according to said article (see notably section 3.6 thereof) integration over all energies of the secondary electrons takes place. For a substantially punctiform region of the specimen around the optical axis a value of 61% is found for the detection efficiency thus determined.

It is an object of the invention to provide a particle-optical apparatus as described in the introductory part of claim 1 in which improved detection efficiency for the secondary electrons is achieved, an adequate field of view of the specimen to be examined or worked nevertheless being maintained. To achieve this, the particle-optical apparatus according to the invention is characterized in that the beam deflection system is arranged between the detection means and said electrostatic electrodes of the focusing device, and that the beam deflection system includes electrodes for deflecting the primary beam by means of at least two electrical deflection fields which have a mutually opposed direction component.

As a result of the described arrangement and the realization of the beam deflection system with two opposite fields it can be achieved that the primary beam is tilted in such a manner that the tilting point is situated at the center of the objective lens, i.e. at the center of the region where the lens effect of the electric objective field can be assumed to be located. This means that upon tilting of the primary beam by the scanning motion, the beam will not leave or will only slightly leave the optical axis of the lens field, so that no additional lens defects (i.e. higher-order defects) of any significance occur and hence the tilting displacement of the beam is not impeded either by the limited dimensions of the aperture of the objective electrodes. This results in a large field of view, without loss of resolution. Furthermore, the beam deflection system comprising two opposed fields has such an effect on the secondary electrons that the paths of the electrons travelling to the detector are shaped in such a manner that a larger part thereof (i.e. larger than in the absence of said step) reaches the detector surface, so that the desired high detection efficiency is achieved.

The focusing device in an embodiment of the particle-optical apparatus according to the invention is arranged to produce a focus of the primary beam exclusively by means of electrostatic electrodes. It is feasible to construct the focusing device (i.e. the objective) so as to have a magnetic as well as an electrical lens field. However, there are circumstances in which the total absence of magnetic means is desirable; in these situations, for example in case of extreme miniaturization, an objective constructed exclusively in electrical form is desirable.

The beam deflection system in a further embodiment of the particle-optical apparatus according to the invention is arranged to produce the electrical deflection fields exclusively by means of electrical electrodes. Like in the case of the objective, it is feasible to construct the beam deflection system so as to have a magnetic as well as an electrical deflection field. Again there may be circumstances in which total absence of magnetic means is desirable; therefore, in such situations a beam deflection system which is constructed exclusively as an electrical system is attractive.

The detection means in another embodiment of the particle-optical apparatus according to the invention comprise a detection material with a detection surface provided with a bore for the primary beam, said surface having an outer diameter which is at least equal to the largest diameter of the bore of the beam deflection system. This step offers a further optimization of the detection efficiency. When the detection surface is arranged close to the nearest electrode, the space angle at which the detection surface is perceived by the electrons to be detected is made maximum, and hence also the value of the detected electron current.

The detection material in a further embodiment of the particle-optical apparatus according to the invention is provided with a further electrostatic acceleration electrode. As has already been mentioned, it is often desirable that the electron beam traverses the electron-optical column with a comparatively high voltage and that it is decelerated to a comparatively low voltage just in front of the specimen. For example, if it is desired that the primary beam arrives at the (grounded) specimen with an energy of 1 kV, the electron source can be adjusted to a voltage of −1 kV relative to ground. By applying a voltage of, for example 9 kV to the further electrostatic acceleration electrode, it is achieved that the primary beam travels through the electron-optical column with a voltage of 10 kV and is decelerated to 1 kV only at the end.

The invention will be described in detail hereinafter with reference to the Figures in which corresponding reference numerals denote corresponding elements. Therein:

Figure 1:
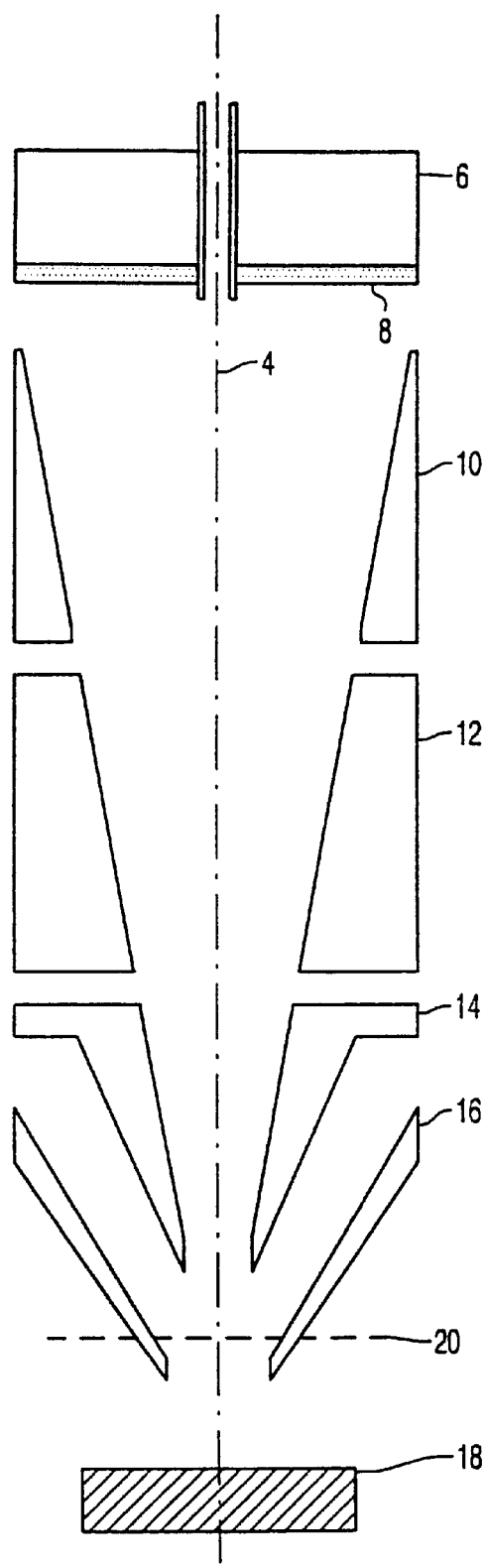
FIG. 1 is a diagrammatic representation of a relevant part of a particle-optical instrument according to the invention.

FIG. 1 shows a relevant part of a SEM according to the invention. In as far as they are not relevant to the invention, the electron source and all further elements forming part of the electron-optical column, serving to accelerate and control the primary beam, are not shown. The primary beam, which is not shown in FIG. 1, travels along the optical axis 4 of the SEM. The primary beam then successively traverses a detector crystal 6, an electrostatic acceleration electrode 8, a first electrical deflection electrode 10, a second electrical deflection electrode 12, a first electrostatic electrode 14 which forms part of the objective and a second electrostatic electrode 16 which also forms part of the objective. Finally, the electrons of the primary beam reach the specimen 18 to be examined or worked.

The detector crystal 6 forms part of detection means for the detection of electrons emanating from the specimen in response to the incidence of the primary beam. This detector crystal consists of a substance (for example, cerium-doped yttrium aluminium garnet or YAG) which produces a light pulse in response to the capture of an electron of adequate energy; this light pulse is conducted further by means of optical guide means (not shown) and is converted, in an opto-electric transducer, into an electrical signal wherefrom an image of the specimen can be derived, if desired. The latter elements also form part of said detection means. The detector crystal 6 is provided with a bore for the passage of the primary beam.

The electrostatic acceleration electrode 8 forms part of the electrode system 8, 14, 16, the electrodes 14 and 16 of which constitute the objective of the SEM which serves to focus the primary beam. The electrode 8 is shaped as a flat plate which is provided with a bore for the primary beam and is deposited on the detection material in the form of a conductive oxide, for example indium and/or tin oxide, notably on the detection surface of the scintillation crystal 6. The electrode 8 can be adjusted to a desired voltage, for example 9 kV, by means of a power supply unit (not shown).

The first electrical deflection electrode 10 and the second electrical deflection electrode 12 form part of a beam deflection system for deflecting the primary beam. Each of these two electrodes is constructed as a tubular portion having an external shape in the form of a straight circular cylinder and an internal shape in the form of a cone which is tapered in the direction of the beam. Each of the electrodes 10 and 12 is subdivided, by way of two sawcuts in mutually perpendicular planes through the optical axis, into four equal parts so that each of the electrodes 10 and 12 is capable of producing electrical dipole fields in the x direction as well as the y direction by application of suitable voltage differences between the portions, so that the primary beam can be deflected across the specimen 18 and the path of the secondary electrons moving in the direction of the detector crystal can be influenced. Instead of subdividing the electrodes 10 and 12 into four parts, they can also be subdivided into a larger number of parts, for example eight equal parts by means of four sawcuts in a plane through the optical axis. By application of the appropriate voltages to the various parts of each of the electrodes, the system thus formed can be used not only for deflecting the beam but also as a stigmator.

The first electrode 14 and the second electrode 16 constitute the electrode system which forms the objective of the SEM. Internally as well as externally the electrode 14 is shaped as a cone which is tapered downwards, so that this electrode fits within the electrode 16. Internally as well as externally the electrode 16 is also shaped as a cone which is tapered downwards; the external conical shape offers optimum space for the treatment of comparatively large specimens such as circular wafers which are used for the manufacture of ICs and may have a diameter of 300 mm. Because of the external conical shape of the electrode 16, the primary beam can be made to strike the wafer at a comparatively large angle by tilting the wafer underneath the objective, without the wafer being obstructed by parts projecting from the objective. A dashed line 20 in the Figure indicates the region in which the lens effect of the electrical objective field (so the paraxial center of the objective) can be assumed to be localized.

The objective 14, 16 focuses the primary beam in such a manner that the electron source is imaged, on the (grounded) specimen with a generally very large reduction; because of this strong reduction, the distance between the surface of the specimen 18 and the center of the lens 20 (the focal distance) is very small which, as has already been mentioned, would severely limit the possibility of tilting if the external shape of the electrode 16 were not conical.

Figure 2:
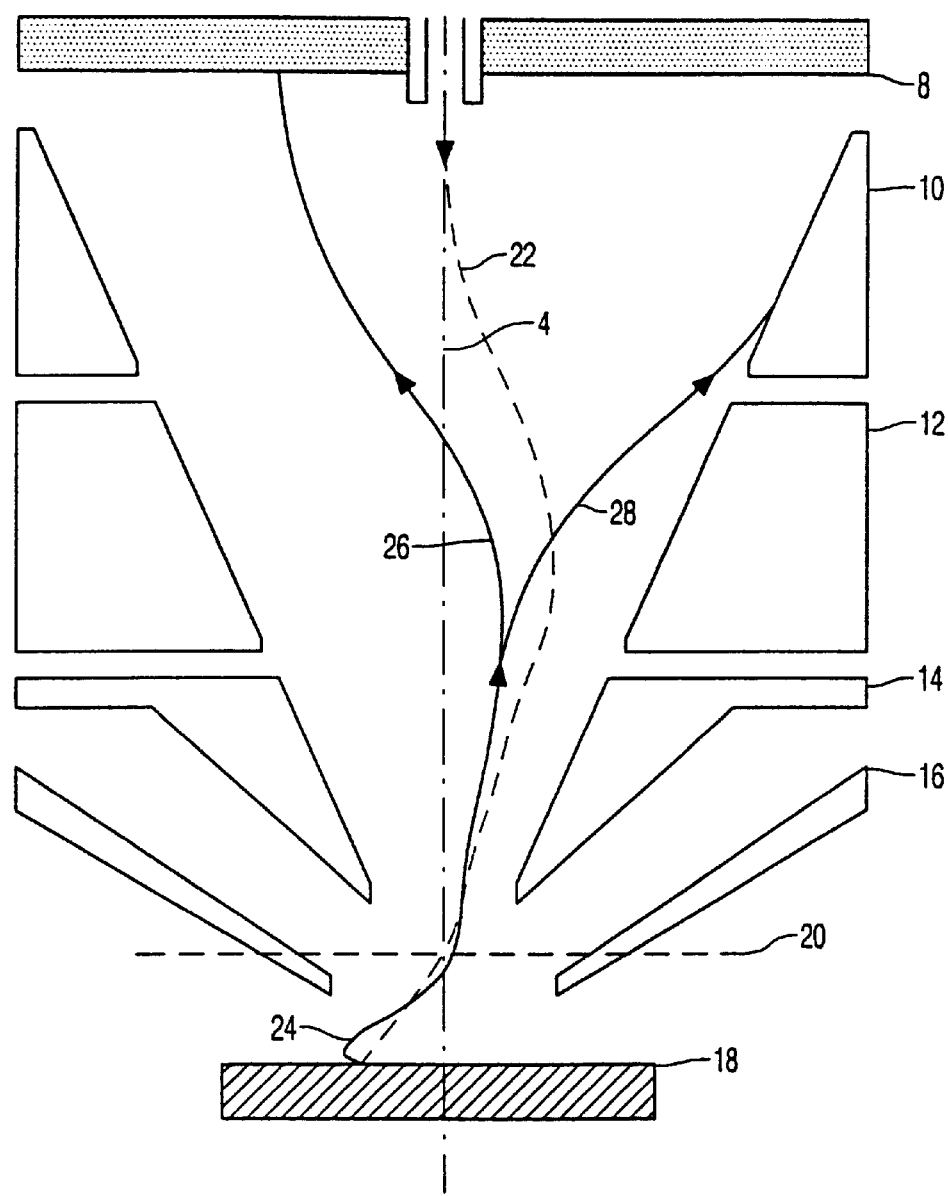
FIG. 2 illustrates the course of some electron paths in a particle-optical instrument according to the invention.

FIG. 2 shows the course of some electron paths in the particle-optical instrument of FIG. 1. The course of these paths has been obtained by way of computer simulation; the following assumptions were made for this simulation: the voltage whereby the primary beam is accelerated amounts to 10 kV; the energy of the secondary electrons is 1 eV; the secondary electron emanates from the specimen parallel to the surface; the specimen is grounded; the voltage $V_d$ at the detector amounts to 9 kV; the voltages at the electrode 10 are 9+2=11 kV and 9−2=7 kV; the voltages at the electrode 12 amount to 9−1.8=7.2 kV and 9+1.8=10.8 kV.

The desired course of the electron paths can also be realized while using other values of the direct voltage and the scan voltage (generally varying as a sawtooth as a function of time) on the multipole electrodes 10 and 12. The choice of said other values is based on the following insight. Adjustment of a high magnification also necessitates a high resolution, but the area to be imaged is comparatively small because of the high magnification. A high resolution requires a comparatively high acceleration voltage at the parts of the column at the level of the decelerating objective lens 14, 16 because of said interaction of the electrons during their travel through the electron optical column and also because the influencing of the electron beam by external disturbing fields should be minimized. This high acceleration voltage can be achieved by supplying the assembly formed by the electrodes 8, 10 and 12 with a comparatively high direct voltage, for example with said value of 9 kV. Because of this high value of the direct voltage, in the case of a large field of view a high value would also be required for the scan voltage on the electrodes 10 and 12 (2 kV for a field of view of 2×2 mm$^2$ with a landing energy of the electron beam on the specimen amounting to 1 keV and a working distance of 3 mm). However, because only a small field of view need be scanned in the case of a high-resolution exposure, in such a case only a comparatively low (in comparison with the direct voltage) amplitude of the scan voltage is required. A further calculation reveals that in such a case it suffices to use an amplitude amounting to some tens of volts, for example 50 V, for a field of view of 50×50 $\mu$m$^2$ for a direct voltage of 9 kV on the electrodes 10 and 12, a landing energy amounting to 1 keV and a working distance amounting to 3 mm.

When a low magnification is adjusted, however, a lower resolution suffices; however, because of the low magnification, the area to be imaged is then greater than in the case of a high resolution. Because of the lower permissible resolution, the acceleration voltage of the electron beam at the level of the scan electrodes 10 and 12 can be chosen to be lower, for example 1.5 kV. Because of this low value of the direct voltage, a low value of the scan voltage at the electrodes 10 and 12 also suffices; however, because in this case a large field of view must be scanned, a comparatively high amplitude of the scan voltage is required. A further calculation reveals that in such a case an amplitude of some hundreds of volts, for example 500 V, is required for a field of view of 2×2 mm$^2$ and a landing energy of 1 keV.

It appears in both cases (high resolution and low resolution) that the scan amplitude required is substantially lower than said first value of 2 kV which was based on a worst case situation (i.e. high direct voltage and large field of view). This lower amplitude for the scan voltage offers significant advantages in respect of the construction of the SEM and the associated power supply equipment. For examle, the power supply equipment can be constructed so as to be significantly smaller and, because of the lower amplitude, its stability (being a fraction of the maximum amplitude to be delivered by this equipment) can be improved proportionally. Furthermore, the supply wires to the various parts of the electrodes 10 and 12 can then be more readily assembled in one cable; because of the risk of electrical breakdowns, such assembly was not or practically not possible in the case of said high voltage of 2 kV.

The primary beam 22 (only diagrammatically represented by a dashed line in this Figure) entering the assembly formed by the detector, the deflection electrodes and the objective initially travels along the optical axis 4. Under the influence of the electrical deflection field generated by the electrode 10, the beam is deflected away from the axis after which it is deflected towards the axis again under the influence of the opposed deflection field generated by the electrode 12. As a result, the primary beam intersects the optical axis far below the deflection electrodes 10 and 12. As has already been stated, as a result of the arrangement of and the fact that the beam deflection system operates with two opposite fields it is achieved that the tilting point is situated in the central plane 20 of the objective, so that a large field of view and a minimum imaging error are achieved, regardless of the magnitude of the scanning motion of the primary beam. This phenomenon can be clearly observed in FIG. 2 which shows that, after deflection by the deflection fields, the primary beam intersects the optical axis 4 in the central plane 20.

The incidence of the primary beam 22 on the specimen 18 releases secondary electrons from specimen which travel upwards under the influence of the electrical field of the objective, of the deflection system and of the detector voltage. The Figure shows a path 24 of such a secondary electron. The electron initially travels parallel to the specimen surface and is pulled into the bore of the objective, after which it becomes subject to the deflector fields. The Figure illustrates the effect of the electrical deflection fields by way of the path 26 and, for comparison, the effect of magnetic deflection fields by way of the path 28. FIG. 2 clearly shows that even a secondary electron which emanates from the specimen at the most unfavorable angle is still deflected by the electrical deflection fields in such a manner that it is still captured by the detector crystal. The latter effect is not achieved by means of the magnetic deflection fields.

Figure 3A:
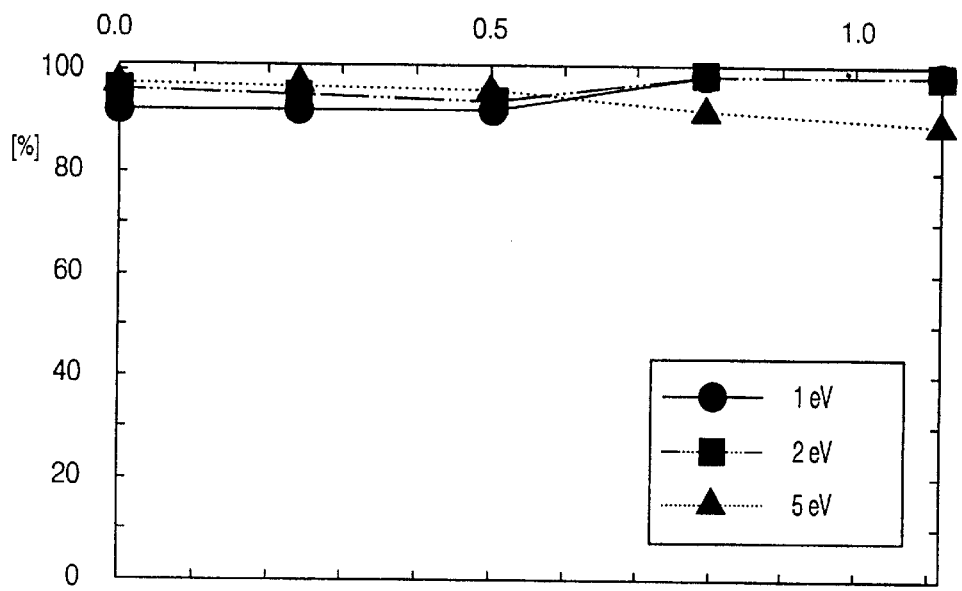
FIGS. 3A and 3B are graphic representations of the detection efficiency in a particle-optical instrument according to the invention.
Figure 3B:
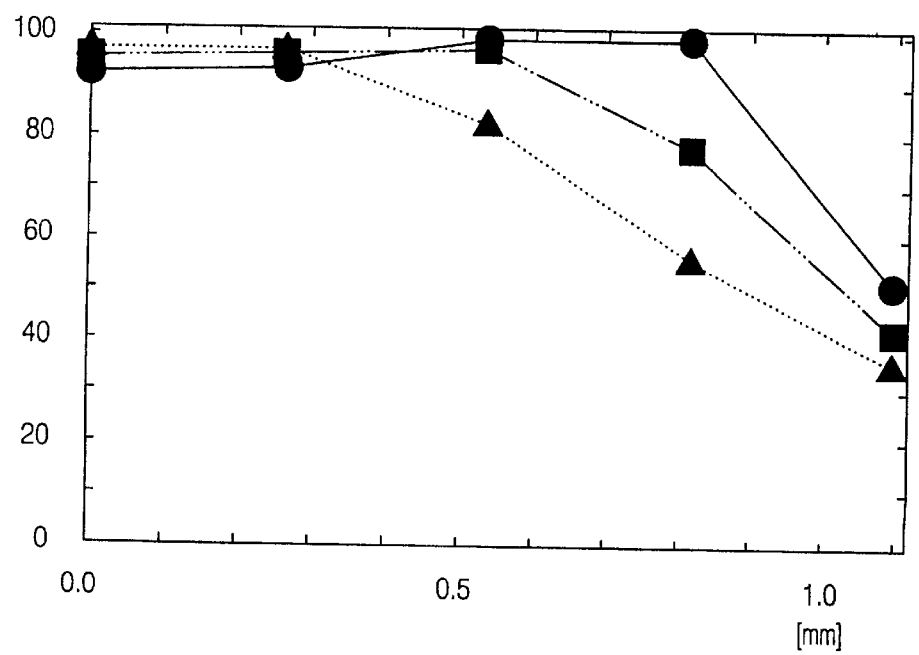

FIGS. 3A and 3B are graphic representations of the detection efficiency as a function of the distance between the optical axis and the location where the secondary electron leaves the specimen. This situation is shown for three values of the energy of the secondary electron, i.e. 1 eV, 2 eV and 5 eV. FIG. 3A illustrates the situation for the case involving electrical deflection fields and FIG. 3B illustrates, for the purpose of comparison, the situation for the case involving magnetic deflection fields. This graphic representation clearly shows that in the case of electrical deflection fields a detection efficiency of more than 90% is achieved as far as the edge of the region observed on the specimen (i.e. up to a distance of approximately 1.1 mm from the optical axis) and that this value decreases to approximately 50% when use is made of magnetic deflection fields.

What is claimed is:

1. A particle-optical apparatus which includes
   a particle source for producing a primary beam (22) of electrically charged particles which travel along an optical axis (4) of the apparatus,
   a specimen holder for a specimen (18) to be irradiated by means of the apparatus,
   a focusing device (14, 16) for forming a focus of the primary beam in the vicinity of the specimen holder by means of electrostatic electrodes,
   a beam deflection system (10, 12) for deflecting the primary beam,
   detection means (6) for detecting electrically charged particles emanating from the specimen in response to the incidence of the primary beam, which detection means are arranged ahead of the focusing device, viewed in the propagation direction of the electrically charged particles in the primary beam, characterized in that
   the beam deflection system (10, 12) is arranged between the detection means (6) and said electrostatic electrodes (14, 16) of the focusing device, and
   that the beam deflection system includes electrodes (10, 12) for deflecting the primary beam by means of at least two electrical deflection fields which have a mutually opposed direction component.

2. A particle-optical apparatus as claimed in claim 1, in which the focusing device (14, 16) is arranged to produce a focus of the primary beam exclusively by means of electrostatic electrodes.

3. A particle-optical apparatus as claimed in claim 1, in which the beam deflection system (10, 12) is arranged to produce the electrical deflection fields exclusively by means of electrical electrodes.

4. A particle-optical apparatus as claimed in claim 1 in which the detection means comprise a detection material with a detection surface (8) provided with a bore for the primary beam, said surface having a diameter which is not smaller than the largest diameter of the bore of the beam deflection system.

5. A particle-optical apparatus as claimed in claim 4, in which the detection material is provided with a further electrostatic acceleration electrode (8).

6. An assembly consisting of a focusing device (8, 14, 16), detection means (6) and a beam deflection system (10, 12) as defined in claim 1.

* * * * *